US012190497B2

(12) United States Patent
Makino et al.

(10) Patent No.: US 12,190,497 B2
(45) Date of Patent: Jan. 7, 2025

(54) INDIVIDUAL IDENTIFICATION SYSTEM

(71) Applicant: NEC Corporation, Tokyo (JP)

(72) Inventors: Kengo Makino, Tokyo (JP); Toru Takahashi, Tokyo (JP); Rui Ishiyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 358 days.

(21) Appl. No.: 17/761,679

(22) PCT Filed: Mar. 30, 2020

(86) PCT No.: PCT/JP2020/014483
§ 371 (c)(1),
(2) Date: Mar. 18, 2022

(87) PCT Pub. No.: WO2021/199123
PCT Pub. Date: Oct. 7, 2021

(65) Prior Publication Data
US 2022/0414851 A1 Dec. 29, 2022

(51) Int. Cl.
*G06T 7/00* (2017.01)
*G06F 16/583* (2019.01)
*G06T 7/38* (2017.01)

(52) U.S. Cl.
CPC .......... *G06T 7/001* (2013.01); *G06F 16/5854* (2019.01); *G06T 7/38* (2017.01); *G06T 2207/30141* (2013.01)

(58) Field of Classification Search
CPC . G06T 7/001; G06T 7/38; G06T 2207/30141; G06F 16/5854
See application file for complete search history.

(56) References Cited

U.S. PATENT DOCUMENTS

| 2005/0254699 A1* | 11/2005 | Sano | G06T 7/001 |
| | | | 382/149 |
| 2021/0264503 A1* | 8/2021 | Hara | G06V 40/10 |
| 2023/0129779 A1* | 4/2023 | Sommer | G06V 10/273 |
| | | | 382/157 |

FOREIGN PATENT DOCUMENTS

| JP | 2006-146737 A | 6/2006 |
| JP | 2008146136 A * | 6/2008 |

(Continued)

OTHER PUBLICATIONS

International Search Report for PCT Application No. PCT/JP2020/014483, mailed on May 26, 2020.

(Continued)

*Primary Examiner* — Edward F Urban
*Assistant Examiner* — Jongbong Nah

(57) ABSTRACT

A registration means for storing an image of a product as a registration image in association with information representing the passing sequence that the product passed through an upstream side process; a management means for managing the matching sequence in a downstream side process; and a matching means for performing matching between an image of a product carried into the downstream side process and the registration image according to the matching sequence, are included. Each time the matching means succeeds in matching, the management means updates the matching sequence to sequence in which registration images not having succeeded in matching with any matching image are put in order on the basis of the passing sequence that the products passed through the upstream side process.

10 Claims, 11 Drawing Sheets

(56) References Cited

FOREIGN PATENT DOCUMENTS

| JP | 2008146436 A | * | 6/2008 |
|----|--------------|---|--------|
| JP | 5498111 B    |   | 5/2014 |
| JP | 2017-079326  |   | 4/2017 |
| JP | 2017079326 A | * | 4/2017 |
| JP | 2018088107 A | * | 6/2018 |

OTHER PUBLICATIONS

Extended European Search Report for EP Application No. EP20928570.9 dated on Sep. 9, 2022.
Anonymous: "python—OpenCV feature matching for multiple images—Stack Overflow", Mar. 21, 2017 (Mar. 21, 2017), URL:https://stackoverflow.com/questions/22272283/opencvfeature-matching-for-multiple-images.

* cited by examiner

| SUBSTRATE ID | FIRST PROCESS | | SECOND PROCESS | | THIRD PROCESS | |
|---|---|---|---|---|---|---|
| | PASSAGE TIME | REGISTRATION IMAGE | PASSAGE TIME | MATCHING IMAGE | PASSAGE TIME | MATCHING IMAGE |
| 001 | 10:01 | G101 | 10:06 | G201 | 10:11 | G301 |
| 002 | 10:02 | G102 | 10:07 | G202 | — | — |
| 003 | 10:03 | G103 | 10:08 | G203 | — | — |
| 004 | 10:04 | G104 | 10:09 | G204 | — | — |
| 005 | 10:05 | G105 | 10:10 | G205 | — | — |
| 006 | 10:06 | G106 | 10:11 | G206 | — | — |
| 007 | 10:07 | G107 | — | — | — | — |
| 008 | 10:08 | G108 | — | — | — | — |
| 009 | 10:09 | G109 | — | — | — | — |
| 010 | 10:10 | G110 | — | — | — | — |

| LINE ID | SUBSTRATE ID | FIRST PROCESS | | SECOND PROCESS | | THIRD PROCESS | |
|---|---|---|---|---|---|---|---|
| | | PASSAGE TIME | REGISTRATION IMAGE | PASSAGE TIME | MATCHING IMAGE | PASSAGE TIME | MATCHING IMAGE |
| L1 | 001 | 10:01 | G101 | 10:06 | G201 | 10:12 | G301 |
| L2 | 001 | 10:01 | G102 | 10:06 | G202 | 10:14 | G302 |
| L1 | 002 | 10:02 | G103 | 10:07 | G203 | 10:13 | G303 |
| L1 | 003 | 10:03 | G104 | 10:07 | G204 | — | — |
| L2 | 002 | 10:03 | G105 | 10:08 | G205 | — | — |
| L1 | 004 | 10:04 | G106 | — | — | — | — |
| L1 | 005 | 10:05 | G107 | — | — | — | — |
| L2 | 003 | 10:05 | G108 | — | — | — | — |
| L1 | 006 | 10:06 | G109 | — | — | — | — |
| L1 | 007 | 10:07 | G110 | — | — | — | — |
| L2 | 004 | 10:07 | G111 | — | — | — | — |

FIG. 10

| PROCESS | MATCHING SEQUENCE |
|---|---|
| SECOND PROCESS (PROCESSING DEVICE 402-1) | (L1,004) (L1,005) (L1,006) (L1,007) |
| SECOND PROCESS (PROCESSING DEVICE 402-2) | (L2,003) (L2,004) |
| THIRD PROCESS (PROCESSING DEVICE 403) | (L1,003) (L2,002) (L1,004) (L1,005) (L2,003) (L1,006) (L1,007) (L2,004) |

353

INDIVIDUAL IDENTIFICATION SYSTEM

This application is a National Stage Entry of PCT/JP2020/014483 filed on Mar. 30, 2020, the contents of all of which are incorporated herein by reference, in their entirety.

TECHNICAL FIELD

The present invention relates to an individual identification system, an individual identification method, and a storage medium.

BACKGROUND ART

There is a case where a product traceability system is required from the viewpoint of reliability. For example, in the case of a production line for circuit boards such as printed wiring boards, in order to analyze information related to devices constituting the production line and inspection, traceability is realized by associating data related to production history with circuit boards that are products. In order to constitute a traceability system in a production line as described above, it is necessary to identify individual products being produced in respective processes constituting the production line.

In order to identify individual products, a method of assigning individual identification information for identifying each product to a product has been known. For example, a label such as a bar code or a QR code (registered trademark) in which individual identification information is printed or a radio frequency identifier (RFID) in which individual identification information is stored is attached to a product. Alternatively, individual identification information is directly printed on a product by means of a laser marker or inkjet. However, in a method of identifying individual products by applying individual identification information to a product, labels to be attached to products or printing facilities for printing on products are required. As a result, the manufacturing cost is increased. Moreover, a method of applying individual identification information to a product requires a work of attaching a label to a product or a work of printing individual identification information on a product.

In view of the above, art of identifying individual products using captured images of the individual products has been proposed. For example, in Patent Literature 1, images of substrates processed in the upstream side process on the substrate manufacturing line are stored in a database as registration images, and with use of images of substrates carried into the downstream side process as matching images, registration images stored in the database are compared with a matching image to identify which registered substrate is identical to the substrate of a matching object.

Further, in the method of identifying individual products by using images, a plurality of registration images and a matching image are compared with each other to be determined whether or not they are identical to each other. Therefore, in the method of identifying individual products by using images, a time required for identifying one product is longer compared with a method of reading an ID that is applied using a bar code, RFID, or the like. Accordingly, a method of reducing the identification time for identifying individual products using images has been proposed.

For example, in Patent Literature 1, a registration image that is identical to a matching image whose identification has been completed is deleted from the database, whereby the number of registration images to be compared with a subsequent matching images is reduced, which enables high-speed processing for identification. Furthermore, in the Patent Literature 1, registration images within the lead time of past substrate manufacturing from the matching clock time is extracted from the database, whereby the number of registration images to be compared with a matching image is reduced, which enables reduction of the identification time.

Further, as art related to the present invention, Patent Literature 2 proposes art that in a one-to-N authentication device that determines which of a plurality of pieces of registration data the matching data matches by using a computer, attribute information of each piece of registration data is extracted in advance, it is compared with attribute information of matching data before performing matching that takes time, and only similar pieces or registration data are selected and matching is performed. In the matching, similarity (matching degree) between the registration data and the matching data is calculated, and the similarity is compared with a preset threshold to perform determination.

Patent Literature 1: JP 2018-88107 A
Patent Literature 2: JP 5498111 B

SUMMARY

As described above, in order to increase the identification speed for identifying individual products using images, while reduction of the total number of registration images that should be compared with a matching image has been performed, it is difficult to promptly detect a registration image that matches a matching image. This is because as long as products are produced continuously on the production line, registration images are stored sequentially in the database. Therefore, even though registration images whose identification has been competed and that are identical to matching images are deleted from the database, still a large amount of registration images exist in the database. Moreover, a large amount of products are produced within the lead time. Furthermore, according to a method for individual identification by comparing the similarity between a matching image and a registration image with a threshold, although it is possible to realize high-speed determination compared with a method of performing comparison with the entire registration images, since it is required to perform comparison with a half of the entire registration images in average, it is difficult to promptly detect a registration image that matches the matching image.

An object of the present invention is to provide an individual identification system that solves the problem described above.

An individual identification system according to one aspect of the present invention is configured to include a registration means for, each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;

a matching sequence management means for managing matching sequence in a downstream side process that is a process downstream of the upstream side process; and a matching means for, each time a product of a matching object is carried into the downstream side process, acquiring a captured image of the product of the matching object as a matching image, and performing matching between the matching image and the registration image stored in the storage device according to the matching sequence.

The matching sequence management means is configured to, each time the matching means succeeds in matching, update the matching sequence to sequence in which registration images not having succeeded in matching with any matching image, among the registration images stored in the storage device, are put in order on the basis of the passing sequence that the products to be registered passed through the upstream side process.

An individual identification method according to another aspect of the present invention is configured to include
- each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;
- managing matching sequence in a downstream side process that is a process downstream of the upstream side process; and
- each time a product of a matching object is carried into the downstream side process, acquiring a captured image of the product of the matching object as a matching image, and performing matching between the matching image and the registration image stored in the storage device according to the matching sequence.

The managing the matching sequence includes, each time the matching succeeds, updating the matching sequence to sequence in which registration images not having succeeded in matching with any matching image, among the registration images stored in the storage device, are put in order on the basis of the passing sequence that the products to be registered passed through the upstream side process.

A computer-readable storage medium according to another aspect of the present invention is configured to store thereon a program for causing a computer to perform processing of:
- each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;
- managing matching sequence in a downstream side process that is a process downstream of the upstream side process; and
- each time a product of a matching object is carried into the downstream side process, acquiring a captured image of the product of the matching object as a matching image, and performing matching between the matching image and the registration image stored in the storage device according to the matching sequence.

The managing the matching sequence includes, each time the matching means succeeds in matching, updating the matching sequence to sequence in which registration images not having succeeded in matching with any matching image, among the registration images stored in the storage device, are put in order on the basis of the passing sequence that the products to be registered passed through the upstream side process.

With the configurations described above, the present invention enables prompt detection of a registration image that matches a matching image.

BRIEF DESCRIPTION OF DRAWINGS

FIG. 3 illustrates an exemplary format of a substrate DB in the individual identification device constituting the individual identification system according to the first exemplary embodiment of the present invention.

FIG. 9 illustrates an exemplary format of a substrate DB in the individual identification device constituting the individual identification system according to the second embodiment of the present invention.

FIG. 10 illustrates an exemplary format of a matching sequence DB in the individual identification device constituting the individual identification system according to the second embodiment of the present invention.

EXEMPLARY EMBODIMENTS

First Exemplary Embodiment

Figure 1:
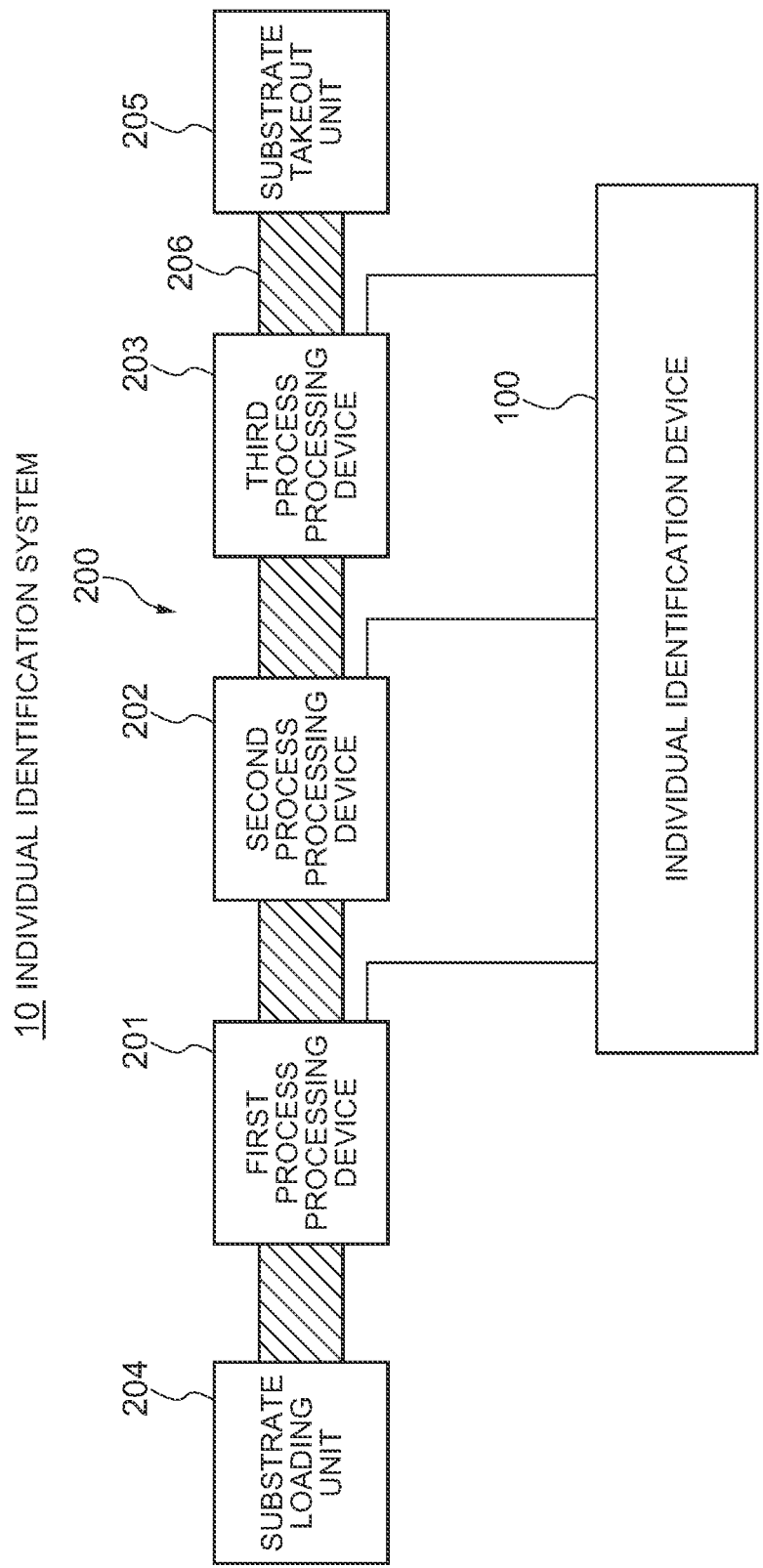
FIG. 1 is a block diagram of an individual identification system according to a first exemplary embodiment of the present invention.

FIG. 1 is a block diagram of an individual identification system 10 according to a first exemplary embodiment of the present invention. The individual identification system 10 includes an individual identification device 100 and a production line 200.

The production line 200 is a line for producing substrates such as printed wiring boards. The production line 200 includes three processing devices namely a first process processing device 201, a second process processing device 202, and a third process processing device 203, a substrate loading unit 204 and a substrate takeout unit 205 disposed before and after them, and a conveying machine 206 such as a conveyer. For example, in the case of a surface mount technology (SMT) line, the first process processing device 201 is a solder printer that applies solder onto substrates, the second process processing device 202 is a component mounter that mounts a plurality of electronic components on predetermined locations of substrates after the solder printing, and the third process processing device 203 is a reflow device that allows a substrate to flow in a thermostatic bath to melt and fix solder in order to fix the mounted components on the substrate. The conveying machine 206 is a means for conveying substrates loaded from the substrate loading unit 204 one by one from the upstream side to the downstream side in the order of the first process processing device 201, the second process processing device 202, the third process processing device 203, and the substrate takeout unit 205.

In principle, the production line 200 has a tendency that a plurality of products having passed through the first process processing device 201 are carried into the second process processing device 202 and the third process processing device 203 while keeping the passing sequence. However, the passing sequence may be disordered due to the reasons as described below.

First, in the production line 200, substrates are inspected at the exit of each of the first process processing device 201, the second process processing device 202, and the third process processing device 203, and a substrate that is defective in machining may not be carried into the next process. For example, in the case of a substrate in which solder printing by the first process processing device 201 is defective, the substrate is removed from the conveying machine 206, and is not carried into the second process processing device 202. Similarly, in the case of a substrate in which mounting of electronic components by the second process processing device 202 is defective, the substrate is removed from the conveying machine 206 and is not carried into the third process processing device 203. Therefore, although the substrates having passed through the first process processing device 201 are carried into the second process processing device 202 and the third process processing device 203 while keeping the passing sequence, it is not always the case that a substrate having passed through the first process processing device 201 at the $j^{th}$ place passes through the second process processing device 202 at the $j^{th}$ place.

Further, between the first process processing device 201 and the second process processing device 202, or/and between the second process processing device 202 and the third process processing device 203, a buffer part in which substrates are temporarily accumulated in random order may be provided. Therefore, when there is a buffer part in which the accumulation number is M (M is a positive integer of 2 or larger) between the first process processing device 201 and the second process processing device 202, a plurality of substrates having passed through the first process processing device 201 do not always pass through the second process processing device 202 and the third process processing device 203 while keeping the passing sequence. A case where a substrate having passed through the first process processing device 201 after M−1 pieces passes through the second process processing device 202 and the third process processing device 203 first may occur.

The individual identification device 100 is an information processing device that manages individuals of substrates produced on the production line 200, in order to perform manufacturing process management, quality management, shipping management, sales management, and the like. The individual identification device 100 is configured to accumulate images of substrates carried into the first process processing device 201 of the production line 200 as registration images, use images of substrates carried into the second process processing device 202 and the third process processing device 203 as matching images, perform matching between the registration images and matching images, and determine which substrate having passed through the first process processing device 201 a substrate having passed through the second process processing device 202 and the third process processing device 203 is.

Figure 2:
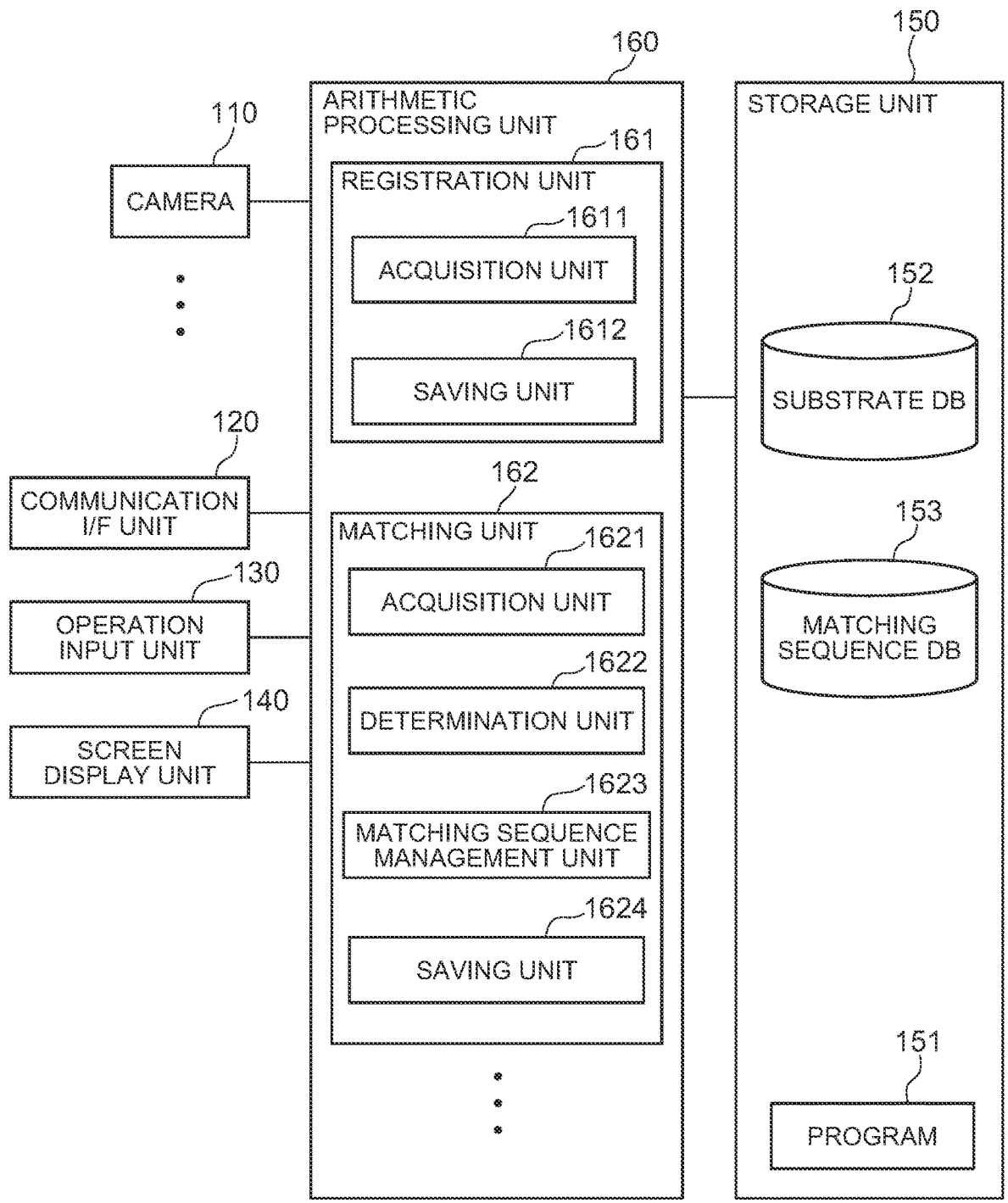
FIG. 2 is a block diagram of an individual identification device constituting the individual identification system according to the first exemplary embodiment of the present invention.

FIG. 2 is a block diagram of the individual identification device 100. Referring to FIG. 2, the individual identification device 100 is configured to include a plurality of cameras 110, a communication interface (I/F) unit 120, an operation input unit 130, a screen display unit 140, a storage unit 150, and an arithmetic processing unit 160.

Each of the cameras 110 is an imaging device that images a substrate that is an object of individual identification. Each of the cameras 110 may be a visible color area camera equipped with a charge-coupled device (CCD) image sensor or a complementary MOS (CMOS) image sensor having a pixel capacity of about several millions pixels, for example. Each of the cameras 110 may be a visible color line camera equipped with a line sensor having a pixel capacity of ten thousand pixels/line, for example. The respective cameras 110 are installed at places where the cameras can capture predetermined areas of the surfaces of substrates carried into the first process processing device 201, the second process processing device 202, and the third process processing device 203 of the production line 200 at predetermined image resolution. As a predetermined area of a surface of a substrate, any area is acceptable if random patterns unique to each substrate exist. For example, a predetermined area of a surface of a substrate may be a part of an area of an upper surface of a substrate or a part of an area of a side surface of a substrate.

The communication I/F unit 120 is configured of a data communication circuit, and is configured to perform data communication with external devices such as the first to third process processing devices 201 to 203 in a wireless or wired manner. The operation input unit 130 is configured of devices such as a keyboard and a mouse, and is configured to detect operation by an operator and output it to the arithmetic processing unit 160. The screen display unit 140 is configured of a device such as a liquid crystal display (LCD), and is configured to display, on a screen, various types of information according to an instruction from the arithmetic processing unit 160.

The storage unit 150 is configured of storage devices such as a hard disk and a memory, and is configured to store therein processing information and a program 151 necessary for various types of processing in the arithmetic processing unit 160. The program 151 is a program for implementing various processing units by being read and executed by the arithmetic processing unit 160, and is read in advance from an external device or a storage medium via a data input-output function such as the communication I/F unit 120 and is stored in the storage unit 150. Main processing information stored in the storage unit 150 includes a substrate database (DB) 152 and a matching sequence DB 153.

The substrate DB 152 is a database for storing information such as images of respective substrates flowing on the production line 200. FIG. 3 illustrates an exemplary format of the substrate DB 152. The substrate DB 152 of this example is configured of a plurality of entries, and one entry is configured of fields for a substrate ID, passage time and a registration image of the first process, passage time and a matching image of the second process, and passage time and a matching image of the third process. In the substrate ID field, an ID such as a serial number assigned to each substrate is set. In the field for passage time and a registration image of the first process, the clock time that the substrate passed through the first process and a substrate image captured when the substrate passed through the first process are set. In the field for passage time and a matching image of the $i^{th}$ (i=2 or 3) process, the clock time that the substrate passed through the $i^{th}$ process and a substrate image captured when the substrate passed through the $i^{th}$ process are set.

Figure 4:
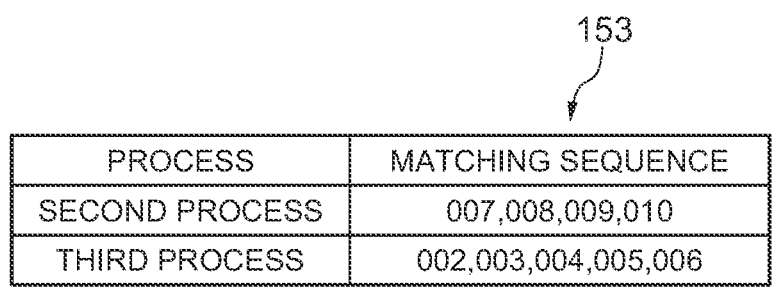
FIG. 4 illustrates an exemplary format of a matching sequence DB in the individual identification device constituting the individual identification system according to the first exemplary embodiment of the present invention.

The matching sequence DB 153 is a database for storing the sequence of registration images in the first process to be compared with a matching image of the $i^{th}$ process. FIG. 4 illustrates an exemplary format of the matching sequence DB 153. The matching sequence DB 153 of this example is configured of a plurality of entries. One entry is configured of fields for a process ID and the matching sequence. In the process ID field, a process ID that uniquely identifies the process is set. In the matching sequence field, the matching sequence that is the sequence of registration images to be compared with a matching image is set. In the example of FIG. 4, the matching sequence is defined by using substrate IDs that can uniquely identify registration images.

The arithmetic processing unit 160 has a processor such as an MPU and the peripheral circuits, and is configured to read and execute the program 151 from the storage unit 150 to allow the hardware and the program 151 to cooperate with each other to thereby implement the various processing units. The main processing units to be implemented by the arithmetic processing unit 160 are a registration unit 161 and a matching unit 162.

The number of the registration units 161 is the same as the number of process processing devices that perform registration of substrate images in the production line 200. That is, in the production line 200 of FIG. 1, since registration of substrate images is performed by the first process processing device 201, only the registration unit 161 corresponding to the first process processing device 201 exists.

The registration unit 161 is configured to acquire an image of a substrate newly carried into the first process processing device 201 of the production line 200, and store it in the substrate DB 152. The registration unit 161 includes an acquisition unit 1611 and a saving unit 1612.

The acquisition unit 1611 is configured to, each time a new substrate is carried into the first process processing device 201 of the production line 200, acquire the substrate ID, the first process passage time, and a substrate image of the substrate. For example, the acquisition unit 1611 is configured to, when receiving a detection signal indicating that a new substrate is carried into the first process processing device 201 from a detection device, not illustrated, provided to the first process processing device 201 via the communication I/F unit 120, acquire an image of a predetermined area of a surface of the substrate from the camera 110 disposed on the first process processing device 201 side. The acquisition unit 1611 is also configured to acquire the clock time that the detection signal is received as the time that the substrate passed through the first process processing device 201, for example. The acquisition unit 1611 is also configured to adopt a new substrate ID for the detected substrate. Note that the passage time may be expressed in year, month, date, hour, minute, second, like 2020, 3, 23, 10:01:35, or may be expressed in hour and second like 10:01.

The saving unit 1612 is configured to secure one new vacant entry in the substrate DB 152, and store the substrate ID, the first process passage time, and the substrate image, acquired by the acquisition unit 1611, in the fields for a substrate ID, first process passage time, and a registration image in the vacant entry. The saving unit 1612 is also configured to store initial values (for example, NULL value) in the respective fields for second process passage time and a matching image, and third process passage time and a matching image, in the secured entry.

The existing number of matching units 162 is the same as the number of processing devices that perform matching of substrate images in the production line 200. That is, in the production line 200 of FIG. 1, since matching of substrate images is performed by the second process processing device 202 and the third process processing device 203, there are two matching units 162 in total, that is, one corresponding to the second process processing device 202 and one corresponding to the third process processing device 203.

The matching unit 162 is configured to manage individual identification of a substrate newly carried into a corresponding process processing device of the production line 200 and the matching sequence for individual identification. The matching unit 162 includes an acquisition unit 1621, a determination unit 1622, a saving unit 1624, and a matching sequence management unit 1624.

The acquisition unit 1621 is configured to, each time a new substrate is carried into a corresponding process processing device, acquire the process passage time and a substrate image of the substrate. For example, the acquisition unit 1621 is configured to, when receiving a detection signal indicating that a new substrate is carried into a corresponding process processing device from a detection device, not illustrated, provided to the corresponding process processing device via the communication IN unit 120, acquire an image of a predetermined area of a surface of the substrate from the camera 110 disposed on the corresponding process processing device side. The acquisition unit 1621 is also configured to acquire the clock time that it received the detection signal as the time that the substrate passed through the corresponding process processing device, for example. The acquisition unit 1621 notifies the determination unit 1622 and the saving unit 1624 of the acquired substrate image as a matching image, and notifies the saving unit 1624 of the acquired process passage time.

The determination unit 1622 is configured to perform matching between the matching image notified from the acquisition unit 1621 and the registration image registered in the substrate DB 152. For example, the determination unit 1622 first reads out the matching sequence of the corresponding process from the matching sequence DB 153. Then, the determination unit 1622 reads out a registration image ranked first in the matching sequence of the corresponding process from the substrate DB 152 and compares it with the matching image, and calculates a score representing the degree of similarity between the two. The score becomes a larger numerical value as the images of the two are more similar, for example. For example, the minimum value of the score is 0, and the maximum value is 1. Then, the determination unit 1622 compares the score with a predetermined determination threshold. Then, the determination unit 1622 determines that the matching has succeeded when the score exceeds the determination threshold, and notifies the saving unit 1624 of the marching success and the substrate ID of the registration image in which the matching has succeeded.

Meanwhile, when the score does not exceed the determination threshold, the determination unit 1622 determines that the matching has failed. In the case of a matching failure, the determination unit 1622 reads out a registration image that is ranked next in the matching sequence of the corresponding process from the substrate DB 152 and compares it with the matching image, and calculates a score representing the degree of similarity between the two. The determination unit 1622 ends repetition of the processing to perform matching between a registration image and the matching image under a condition that a registration image whose score exceeds the determination threshold appears or matching with the registration image whose matching sequence is the lowest in the corresponding process has completed, whichever comes first. When matching between a registration image whose matching sequence is the lowest and the matching image has failed, the determination unit 1622 notifies the saving unit 1624 of the matching failure.

The saving unit 1624 is configured to update the substrate DB 152 according to the process passage time corresponding to the matching image notified from the acquisition unit 1621, presence or absence of a matching success notified from the determination unit 1622, and the substrate ID of the registration image in which matching has succeeded. For example, in the case of a matching success, the saving unit 1624 searches the substrate DB 152 for an entry having the substrate ID whose matching has succeeded, and stores the corresponding process passage time and the matching image notified from the acquisition unit 1621 in the corresponding fields for the process passage time and the matching image of the searched entry. Then, the saving unit 1624 notifies the matching sequence management unit 1624 of a matching sequence update request. Meanwhile, in the case of a matching failure, the saving unit 1624 outputs, to the screen display unit 140, an error massage indicating that no registration image matching the matching image is stored in the substrate DB 152, or/and outputs it to the external device via the communication I/F unit 120.

The matching sequence determination unit 1623 is configured to, upon receipt of a notification of a matching sequence update request from the saving unit 1624, update the matching sequence of the corresponding process on the basis of the latest contents of the substrate DB 152. For example, the matching sequence determination unit 1623 extracts all entries in which the fields for passage time and matching images of the corresponding process have a NULL value from among the entries of the substrate DB 152, creates a substrate ID string in which the substrate IDs stored in the fields for the substrate ID of the extracted entries are aligned in the order of the first process passage time (descending order of the passage time) of the entry, and stores (rewrites) the substrate ID string in the field for the matching sequence of the corresponding process in the matching sequence DB 153.

Figure 5:
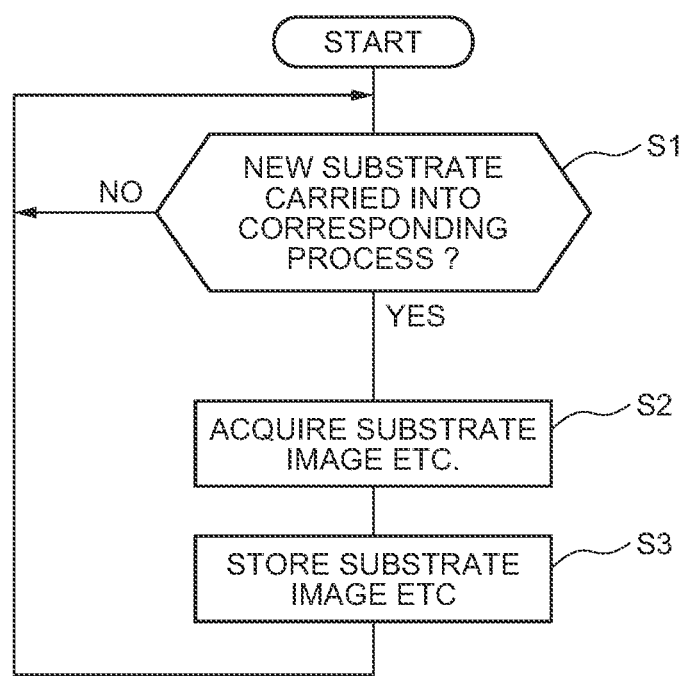
FIG. 5 is a flowchart illustrating an example of a registration operation of the individual identification device constituting the individual identification system according to the first exemplary embodiment of the present invention.
Figure 6:
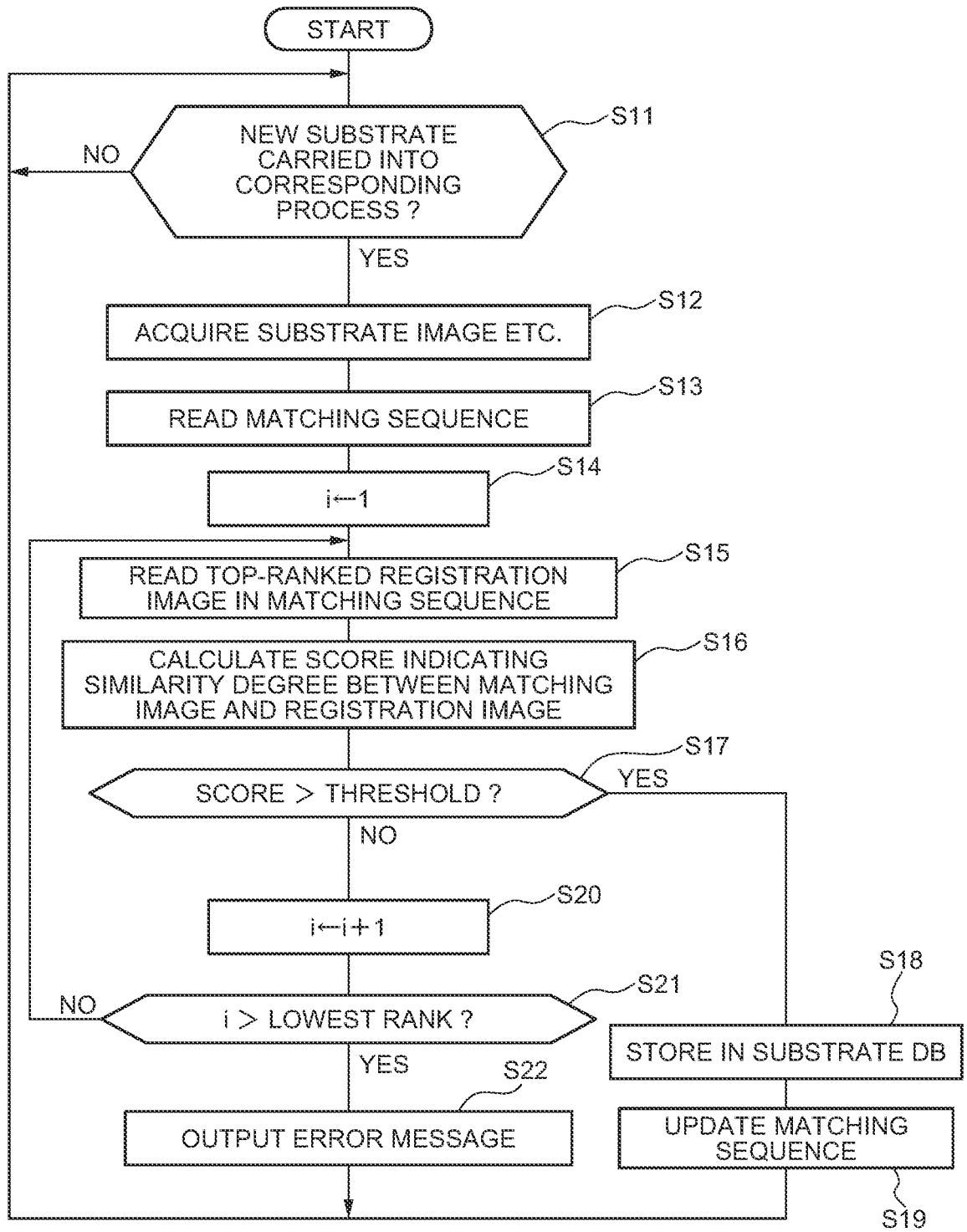
FIG. 6 is a flowchart illustrating an example of a matching operation of the individual identification device constituting the individual identification system according to the first exemplary embodiment of the present invention.

Next, operation of the individual identification device 100 will be described. Operation of the individual identification device 100 includes a registration operation and a matching operation. FIG. 5 is a flowchart showing an example of a registration operation of the individual identification device 100. FIG. 6 is a flowchart showing an example of a matching operation of the individual identification device 100.

First, a registration operation of the individual identification device 100 will be described. A registration operation is performed by the registration unit 161. First, when the acquisition unit 1611 of the registration unit 161 detects that a new substrate is carried into the first process processing device 201 of the production line 200 (step S1), the acquisition unit 1611 acquires a substrate image, the first process passage time, and the substrate ID of the substrate (step S2). Then, the saving unit 1612 stores the substrate ID, the first step passage time, and the substrate image acquired by the acquisition unit 1611, in the respective fields for a substrate ID, first process passage time, and a registration image of a vacant entry secured in the substrate DB 152 (step S3).

As described above, in the registration operation, each time a substrate passes through the first process processing device 201 of the production line 200, the substrate ID, the first process passage time, and a substrate image (registration image) of the substrate are stored in the substrate DB 152.

Next, a matching operation of the individual identification device 100 will be described. A matching operation is performed by the matching unit 162. FIG. 6 is a flowchart of the matching operation by the matching unit 162. First, with reference to FIG. 6, a matching operation by the matching unit 162 corresponding to the second process processing device 202 will be described.

First, when the acquisition unit 1621 of the matching unit 162 corresponding to the second process processing device 202 detects that a new substrate is carried into the second process processing device 202 (step S11), the acquisition unit 1621 acquires the second process passage time and a matching image (substrate image) of the substrate (step S12). Then, the determination unit 1622 of the matching unit 162 first reads out the matching sequence (substrate ID string) of the second process from the matching sequence DB 153 (step S13). Then, the determination unit 1622 sets 1 to the internal variable i representing the rank (step S14), and reads out a registration image of the substrate ID in the $i^{th}$ rank from the top in the matching sequence, from the substrate DB 152 (step S15). Then, the determination unit 1622 calculates a score representing the degree of similarity between the matching image and the registration image (step S16). Then, the determination unit 1622 compares the score with a threshold (step S17).

When the score is larger than the threshold, the matching succeeds, and the saving unit 1624 stores the second process passage time and the matching image in the fields for second process passage time and a matching image of the entry having the registration image in which matching has succeeded in the substrate DB 152 (step S18). Then, the matching sequence determination unit 1623 updates the matching sequence of the second process in the matching sequence DB 153 on the basis of the latest contents of the substrate DB 152 (step S19). Then, the matching unit 162 returns to step S11 and repeats the same processing as that described above.

An example of the operation at step S19 will be described below using the case where the latest contents of the substrate DB 152 are those illustrated in FIG. 3, for example. First, the matching sequence determination unit 1623 extracts all entries in which the second process passage time and the matching images have NULL values, among the entries of the substrate DB 152. In the case of FIG. 3, entries in the four rows from the bottom are extracted. Then, the matching sequence determination unit 1623 creates a substrate ID string in which the substrates IDs stored in the substrate ID fields in the extracted entries are aligned in the order of the first process passage time of the entry. In the case of FIG. 3, the substrate ID string is "007", "008", "009", "010". Then, the matching sequence determination unit 1623 writes the substrate ID string onto the field for the second process matching sequence in the matching sequence DB 153.

When the score is not larger than the threshold, the determination unit 1622 increments the internal variable i by 1 (step S20), confirms that i is not larger than the lowest rank in the matching sequence (step S21), and returns to step S15 and repeats processing that is similar to the processing described above. Note that when i becomes larger than the lowest rank in the matching sequence, it means that the matching has failed even thought comparison between the entire registration images and the matching image according to the matching sequence has been completed. In that case, the saving unit 1624 outputs an error message (step S22), and ends the processing of FIG. 6.

Next, with reference to FIG. 6, a matching operation by the matching unit 162 corresponding to the third process processing device 203 will be described.

First, when the acquisition unit 1621 of the matching unit 162 corresponding to the third process processing device 203 detects that a new substrate is carried into the third process processing device 203 (step S11), the acquisition unit 1621 acquires the third process passage time and a matching image (substrate image) of the substrate (step S12). Then, the determination unit 1622 of the matching unit 162 first reads out the matching sequence (substrate ID string) of the third process from the matching sequence DB 153 (step S13). Then, the determination unit 1622 sets 1 to the internal variable i representing the rank (step S14), and reads out a registration image of the substrate ID in the $i^{th}$ rank from the top in the matching sequence, from the substrate DB 152 (step S15). Then, the determination unit 1622 calculates a score representing the degree of similarity between the matching image and the registration image (step S16). Then, the determination unit 1622 compares the score with a threshold (step S17).

When the score is larger than the threshold, the matching succeeds, and the saving unit 1624 stores the third process passage time and the matching image in the fields for the third process passage time and a matching image of the entry having the registration image in which the matching has succeeded in the substrate DB 152 (step S18). Then, the matching sequence determination unit 1623 updates the matching sequence of the third process in the matching sequence DB 153 on the basis of the latest contents of the substrate DB 152 (step S19). Then, the matching unit 162 returns to step S11 and repeats the processing similar to that described above.

An example of the operation at step S19 will be described below using the case where the latest contents of the substrate DB 152 are those illustrated in FIG. 3, for example. First, the matching sequence determination unit 1623 extracts all entries in which the third process passage time and the matching images have NULL values, among the entries of the substrate DB 152. In the case of FIG. 3, entries in the nine rows from the bottom are extracted. Then, the matching sequence determination unit 1623 creates a substrate ID string in which the substrates IDs stored in the fields for the substrate ID in the extracted entries are aligned in the order of the first process passage time of the entry. In the case of FIG. 3, the substrate ID string is "002", "003", "004", "005", "006", "007", "008", "009", "010". Then, the matching sequence determination unit 1623 writes the substrate ID string onto the field for the third process matching sequence in the matching sequence DB 153.

When the score is not larger than the threshold, the determination unit 1622 increments the internal variable i by 1 (step S20), confirms that i is not larger than the lowest rank in the matching sequence (step S21), and returns to step S15 and repeats the processing that is similar to the processing described above. Note that when i becomes larger than the lowest rank in the matching sequence, it means that the matching has failed even thought comparison between the entire registration images and the matching image according to the matching sequence has been completed. In that case, the saving unit 1624 outputs an error message (step S22), and ends the processing of FIG. 6.

As described above, in the matching operation, with use of a substrate image of a substrate carried into the second process processing device 202 (or third process processing device 203) as a matching image, and a substrate image of a substrate stored in the substrate DB 152 as a registration image, matching is performed between the matching image and the registration image. Thereby, it is determined to which substrate stored in the substrate DB 152 the substrate carried into the second process processing device 202 (or third process processing device 203) is identical. Then, when the matching of the substrate image (matching image) of the substrate carried into the second process processing device 202 (or third process processing device 203) succeeds, the matching sequence of the second process (or third process) is updated.

As described above, according to the present embodiment, it is possible to promptly detect a registration image matching the matching image. The reason is that the matching sequence of registration images on which matching with the matching image is performed is determined by utilizing a feature of the production line 200 that a plurality of substrates passing through the first process processing device 201 tend to be carried into the second process processing device 202 and the third process processing device 203 while keeping the passing sequence. Moreover, a registration image that matches the matching image is determined by comparing a score representing the degree of similarity between the matching image and the registration image with a determination threshold.

Second Exemplary Embodiment

Figure 7:
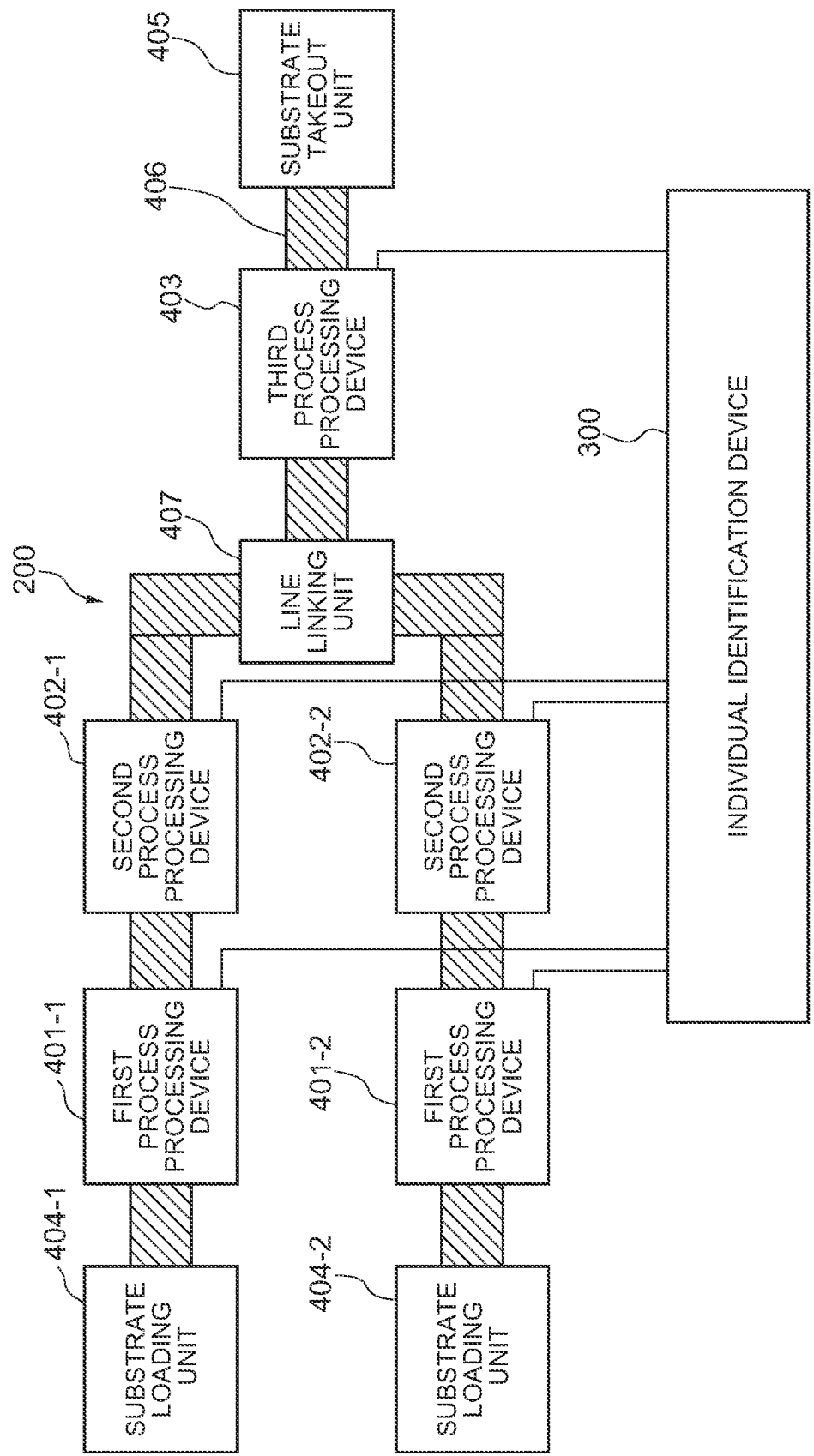
FIG. 7 is a block diagram of an individual identification system according to a second exemplary embodiment of the present invention.

FIG. 7 is a block diagram of an individual identification system 20 according to a second exemplary embodiment of the present invention. The individual identification system 20 includes an individual identification device 300 and a production line 400.

The production line 400 differs from the production line 200 of FIG. 1 in that the production line 400 is configured to include two lines each having a substrate loading unit 404, a first process processing device 401, and a second process processing device 402, one line of a third process processing device 403 and a substrate takeout unit 405, and a line linking unit 407 is provided between the second process processing devices 402 and the third process processing device 403. In the production line 400, a substrate loaded from a substrate loading unit 404-1 passes through a first process processing device 401-1 and a second process processing device 402-1 in this order by a conveying machine 406, and is carried into the third process processing device 403 via the line linking unit 407. Further, a substrate loaded from a substrate loading unit 404-2 passes through a first process processing device 401-2 and a second process processing device 402-2 in this order by the conveying machine 406, and is carried into the third process processing device 403 via the line linking unit 407.

The individual identification device 300 is an information processing device that manages individuals of substrates produced in the production line 400 in order to perform manufacturing step management, quality management, shipping management, sales management, and the like. The individual identification device 300 is configured such that images of substrates carried into the first process processing devices 401-1 and 401-2 of the production line 400 are accumulated as registration images, images of substrates carried into the second process processing devices 402-1 and 402-2 and the third process processing device 403 are used as matching images, and matching is performed between the registration images and the matching images, so that it is determined which of the substrates passing through the first process processing devices 401-1 and 401-2 each of the substrates passing through the second process processing devices 402-1 and 402-2 and the third process processing device 403 is.

Figure 8:
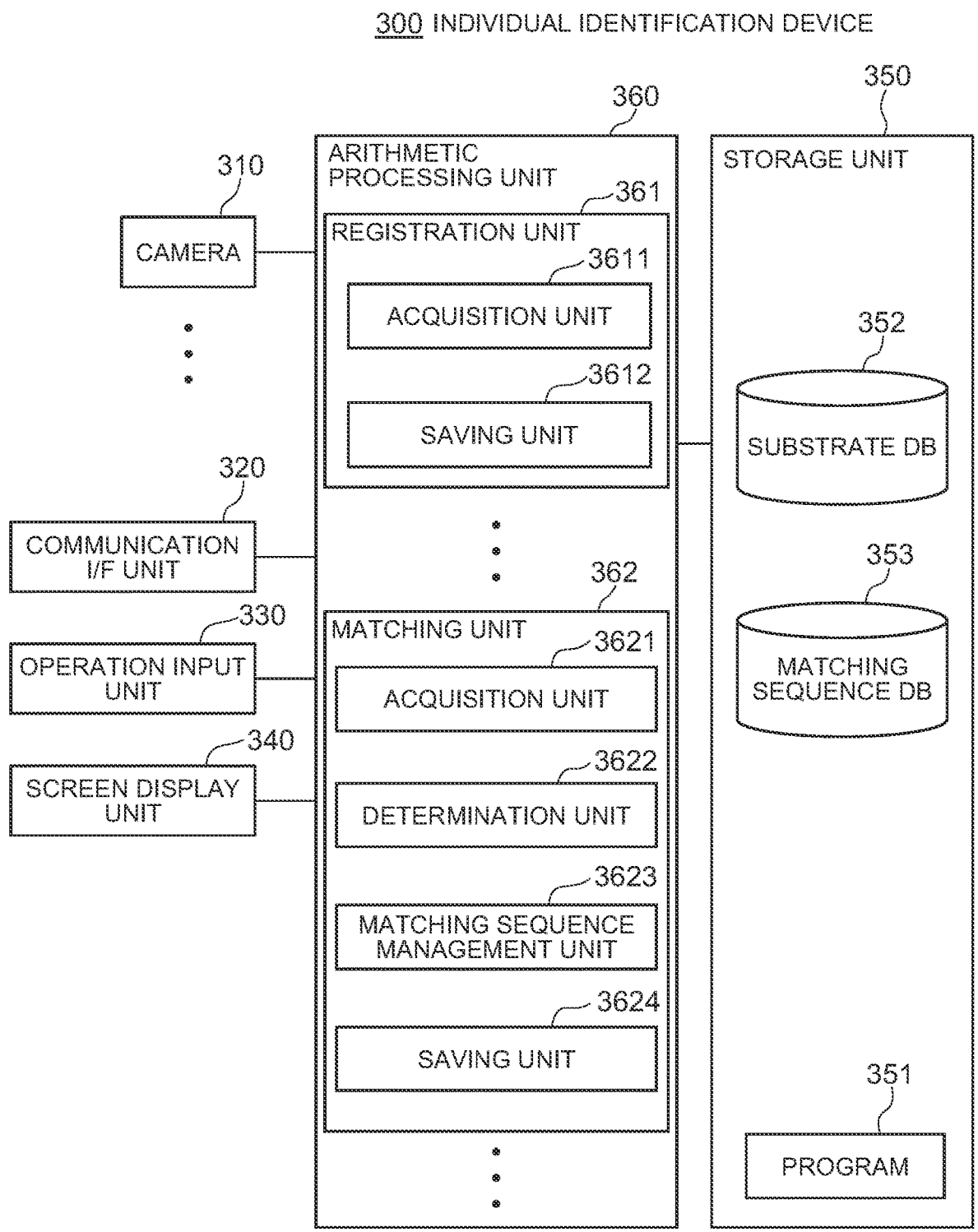
FIG. 8 is a block diagram of an individual identification device constituting the individual identification system according to the second exemplary embodiment of the present invention.

FIG. 8 is a block diagram of the individual identification device 300. Referring to FIG. 8, the individual identification device 300 includes a plurality of cameras 310, a communication OF unit 320, an operation input unit 330, a screen display unit 340, a storage unit 350, and an arithmetic processing unit 360. Among them, the camera 310, the communication I/F unit 320, the operation input unit 330, and the screen display unit 340 are configured similarly to the camera 110, the communication I/F unit 120, the operation input unit 130, and the screen display unit 140 of FIG. 1.

The storage unit 350 is configured of storage devices such as a hard disk and a memory, and is configured to store therein processing information and a program 351 necessary for various types of processing in the arithmetic processing unit 360. The program 351 is a program for implementing various processing units by being read and executed by the arithmetic processing unit 360, and is read in advance from an external device or a storage medium via a data input-output function such as the communication I/F unit 320 and is stored in the storage unit 350. Main processing information stored in the storage unit 350 includes a substrate database (DB) 352 and a matching sequence DB 353.

The substrate DB 352 is a database for storing information such as images of substrates flowing through the production line 400. FIG. 9 illustrates an exemplary format of the substrate DB 352. The substrate DB 352 of this example is configured of a plurality of entries, and one entry is configured of fields for a line ID, a substrate ID, passage time and a registration image of the first process, passage time and a matching image of the second process, and passage time and a matching image of the third process. In the line ID field, a line number of a production line is set. In the case of the production line 400 of FIG. 7, a line ID of a line on which the substrate loading unit 404-1, the first process processing device 201-1, the second process processing device 202-1, and the third process processing device 203 are provided is L1, and a line ID of a line on which the substrate loading unit 404-2, the first process processing device 201-2, and the second process processing device 202-2 are provided is L2. In the substrate ID field, the passage time field, and the registration image field of the first process, the clock time when a substrate passed through the first process processing device 401-1 or 401-2 and a substrate image captured when the substrate passed through the first process processing device 401-1 or 401-2 are set. In the passage time field and the matching image field of the second process, the clock time when a substrate passed through the second process processing device 402-1 or 402-2 and a substrate image captured when the substrate passed through the second process processing device 402-1 or 402-2 are set. In the passage time field and the matching image field of the third process, the clock time when a substrate passed through the third process processing device 403 and a substrate image captured when the substrate passed through the third process processing device 403 are set.

The matching sequence DB 353 is a database in which the matching sequence of registration images used in the process of performing matching of a substrate image is stored. FIG. 10 illustrates an exemplary format of the matching sequence DB 353. The matching sequence DB 353 of this example is configured of a plurality of entries, and one entry is configured of fields for a process ID and the matching sequence. In the process ID field, a process ID that uniquely identifies the process is set. In the matching sequence field, the matching sequence that is the sequence of registration images to be compared with a matching image is set. In FIG. 10, since a registration image cannot be uniquely identified only with the substrate ID, the matching sequence is defined by using a combination of the line ID and the substrate ID. Moreover, since the second process is divided to the processing device 402-1 and the processing device 402-2 in this example, setting is made by separating the two devices.

The arithmetic processing unit 360 has a processor such as an MPU and the peripheral circuits, and is configured to read and execute the program 351 from the storage unit 350 to allow the hardware and the program 351 to cooperate with each other to thereby implement various processing units. The main processing units to be implemented by the arithmetic processing unit 360 are a registration unit 361 and a matching unit 362.

The number of the registration units 361 is the same as the number of processing units that perform registration of substrate images in the production line 400. That is, in the production line 400 of FIG. 7, since registration of substrate images is performed by the first process processing device 401-1 and the second process processing device 401-2, there are two registration units 361 corresponding to the first process processing device 401-1 and the second process processing device 401-2, respectively.

The registration unit 361 is configured to acquire an image of a substrate newly carried into a corresponding process processing device of the production line 400, and store it in the substrate DB 352. The registration unit 361 includes an acquisition unit 3611 and a saving unit 3612.

The acquisition unit 3611 is configured to, each time a new substrate is carried into a corresponding process processing device of the production line 400, acquire the substrate ID, the first process passage time, and a substrate image of the substrate. For example, the acquisition unit 3611 is configured to, when receiving a detection signal indicating that a new substrate is carried into a corresponding process processing device from a detection device, not illustrated, provided to the corresponding process processing device via the communication I/F unit 320, acquire an image of a predetermined area of a surface of the substrate from a camera 310 provided to the corresponding process processing device side. The acquisition unit 3611 is also configured to acquire the clock time that it received the detection signal as the time that the substrate passed through the corresponding process processing device, for example. The acquisition unit 3611 is also configured to number a new substrate ID to the detected substrate. The acquisition unit 3611 is also configured to acquire a line ID set in advance with respect to the corresponding process processing device.

The saving unit 3612 is configured to secure one new entry in the substrate DB 352, and store the line ID, the substrate ID, the first step passage time, and the substrate image acquired by the acquisition unit 3611, in the respective fields for a line ID, a substrate ID, first process passage time, and a registration image of the vacant entry. The saving unit 3612 is also configured to store the initial values (for example, NULL value) in the fields for the second process passage time and a matching image and the third process passage time and a matching image of the secured entry.

The number of the matching units 162 is the same as the number of processing units that perform matching of substrate images in the production line 400. That is, in the production line 400 of FIG. 7, since matching of substrate images is performed by the second process processing devices 402-1 and 402-2 and the third process processing device 403, there are three matching units 162 corresponding to the second process processing device 402-1, the second process processing device 402-2, and the third process processing device 403, respectively.

The matching unit 362 is configured to perform individual identification of a substrate newly carried into a corresponding process processing device of the production line 400 and to manage the matching sequence of the individual identification. The matching unit 362 includes an acquisition unit 3621, a determination unit 3622, a saving unit 3624, and a matching sequence management unit 3623.

The acquisition unit 3621 is configured to, each time a new substrate is carried into a corresponding process processing device, acquire the first process passage time and a substrate image of the substrate by the same method as that used by the acquisition unit 1632 of the first exemplary embodiment. The acquisition unit 3621 notifies the determination unit 3622 and the saving unit 3624 of the acquired substrate image as a matching image, and notifies the saving unit 3624 of the acquired corresponding process passage time.

The determination unit 3622 is configured to perform matching between the matching image notified from the acquisition unit 3621 and the registration image registered in the substrate DB 352. For example, the determination unit 3622 first reads out the matching sequence of the corresponding process (processing device) from the matching sequence DB 353. Then, the determination unit 3622 reads out the registration image ranked first from the top in the matching sequence of the corresponding process (processing device) from the substrate DB 352 and compares it with a matching image, calculates a score representing the degree of similarity between the two images, and when the score exceeds a determination threshold, determines that the matching has succeeded, and notifies the saving unit 3624 of the matching success and the substrate ID and the line ID of the registration image in which the matching has succeeded.

Meanwhile, when the score does not exceed the determination threshold, the determination unit 3622 determines that the matching has failed. In the case of a matching failure, the determination unit 3622 reads out a registration image at the next rank from the top in the matching sequence of the corresponding process (processing device) from the substrate DB 352 and compares it with the matching image, and calculates a score representing the degree of similarity between the two. The determination unit 3622 ends repetition of the processing to perform matching between a registration image and the matching image under a condition that a registration image whose score exceeds the determination threshold appears or a condition that matching with the registration image whose matching sequence is the lowest in the corresponding process (processing device) has completed, whichever comes first. When matching between the registration image whose matching sequence is the lowest and the matching image fails, the determination unit 3622 notifies the saving unit 3624 of the matching failure.

The saving unit 3624 is configured to update the substrate DB 152 according to the process passage time corresponding to the matching image notified from the acquisition unit 3621, presence or absence of a matching success notified from the determination unit 3622, and the substrate ID and the line ID of the registration image with which matching has succeeded. For example, in the case of a matching success, the saving unit 3624 searches the substrate DB 352 for an entry having the substrate ID and the line ID in which matching has succeeded, and stores the corresponding process passage time and the matching image notified from the acquisition unit 3621 in the corresponding fields for the corresponding process passage time and the matching image of the searched entry. Then, the saving unit 3624 notifies the matching sequence management unit 3624 of an update request for the matching sequence. Meanwhile, in the case of a matching failure, the saving unit 3624 outputs, to the screen display unit 340, an error massage indicating that no registration image matching the matching image is stored in the substrate DB 352, or/and outputs it to the external device via the communication I/F unit 120.

The matching sequence determination unit 3623 is configured to, upon receipt of a notification of a matching sequence update request from the saving unit 3624, update the matching sequence of the corresponding process (processing device) on the basis of the latest contents of the substrate DB 152. For example, the matching sequence determination unit 3623 extracts all entries in which the fields for the passage time and matching images of the corresponding process have a NULL value among the entries of the substrate DB 352, creates a line ID/substrate ID string in which sets of line IDs and substrate IDs stored in the fields for the line ID and substrate ID of the extracted entries are aligned in the order of the passage time of the first process of the entry, and stores (rewrites) the line ID/substrate ID string in the field for the matching sequence of the corresponding process (processing device) in the matching sequence DB 353.

Next, operation of the individual identification device 300 will be described. Operation of the individual identification device 300 includes a registration operation and a matching operation.

First, a registration operation of the individual identification device 100 will be described using FIG. 5 illustrating a flowchart of a registration operation in the first exemplary embodiment. A registration operation is performed by the registration unit 361.

First, a registration operation by the registration unit 361 corresponding to the first process processing device 401-1 will be described. When the acquisition unit 3611 of the registration unit 361 detects that a new substrate is carried into the first process processing device 401-1 of the production line 400 (step S1), the acquisition unit 3611 acquires the line ID, a substrate image, the first process passage time, and the substrate ID of the substrate (step S2). Then, the saving unit 3612 stores the line ID, the substrate ID, the first step passage time, and the substrate image, acquired by the acquisition unit 3611, in the respective fields for the line ID, the substrate ID, the first process passage time, and a registration image of a vacant entry secured in the substrate DB 352 (step S3).

Next, a registration operation by the registration unit 361 corresponding to the first process processing device 401-2 will be described. When the acquisition unit 3611 of the registration unit 361 detects that a new substrate is carried into the first process processing device 401-2 of the production line 400 (step S1), the acquisition unit 3611 acquires the line ID, a substrate image, the first process passage time, and the substrate ID of the substrate (step S2). Then, the saving unit 3612 stores the line ID, the substrate ID, the first step passage time, and the substrate image, acquired by the acquisition unit 3611, in the respective fields for the line ID, the substrate ID, the first process passage time, and a registration image of a vacant entry secured in the substrate DB 352 (step S3).

As described above, in the registration operation, each time a substrate passes through the first process processing device 401-1 or 401-2 of the production line 400, the line ID, the substrate ID, the first process passage time, and a substrate image (registration image) of the substrate are stored in the substrate DB 352.

Next, a matching operation of the individual identification device 300 will be described. A matching operation is performed by the matching unit 362.

First, a matching operation by the matching unit 362 corresponding to the second process processing device 402-1 will be described using FIG. 6 illustrating a flowchart of a matching operation in the first exemplary embodiment. First, when the acquisition unit 3621 of the matching unit 362 detects that a new substrate is carried into the second process processing device 402-1 (step S11), the acquisition unit 3621 acquires the line ID, the second process passage time, and a matching image (substrate image) of the substrate (step S12). Then, the determination unit 3622 of the matching unit 362 first reads out the matching sequence (line ID/substrate ID string) of the second process (processing device 402-1) from the matching sequence DB 353 (step S13). Then, the determination unit 3622 sets 1 to the internal variable i representing the rank (step S14), and reads out a registration image of the line ID and the substrate ID in the $i^{th}$ rank from the top in the matching sequence, from the substrate DB 352 (step S15). Then, the determination unit 3622 calculates a score representing the degree of similarity between the matching image and the registration image (step S16). Then, the determination unit 3622 compares the score with a threshold (step S17).

When the score is larger than the threshold, the matching has succeeded, and the saving unit 3624 stores the second process passage time and the matching image in the fields for the second process passage time and a matching image of the entry having the registration image in which the matching has succeeded, in the substrate DB 352 (step S18). Then, the matching sequence determination unit 3623 updates the matching sequence of the second process (processing device 402-1) in the matching sequence DB 353 on the basis of the latest contents of the substrate DB 352 (step S19). Then, the matching unit 362 returns to step S11 and repeats the processing similar to that described above.

An example of the operation at step S19 will be described below using the case where the latest contents of the substrate DB 352 are those illustrated in FIG. 9, for example. First, the matching sequence determination unit 3623 extracts all entries in which the second process passage time and the matching images have a NULL value, among the entries of the substrate DB 352. In the case of FIG. 9, entries in the nine rows from the bottom are extracted. Then, the matching sequence determination unit 3623 extracts, from the extracted entries, all entries in which the line ID stored in the line ID field is the same line ID as that of the second process processing device 402-1. In the case of FIG. 9, four entries in total, that is, the second, third, fifth, and sixth entries from the bottom, are extracted. Then, the matching sequence determination unit 3623 creates a line ID/substrate ID string in which sets of the line IDs stored in the line ID fields and the substrates IDs stored in the substrate ID fields (line ID/substrate ID) in the extracted entries are aligned in the order of the first process passage time of the entry. In the case of FIG. 9, the line ID/substrate ID string is "L1, 004", "L1, 005", "L6, 006", "L1, 007". Then, the matching sequence determination unit 3623 writes the line ID/substrate ID string onto the matching sequence field of the second process (processing device 402-1) in the matching sequence DB 353.

When the score is not larger than the threshold, the determination unit 3622 increments the internal variable i by 1 (step S20), confirms that i is not larger than the lowest rank in the matching sequence (step S21), and returns to step S15 and repeats processing that is similar to the processing described above. Note that when i becomes larger than the lowest rank in the matching sequence, it means that the matching has failed even thought comparison between the entire registration images and the matching image has been completed according to the matching sequence. In that case, the saving unit 3624 outputs an error message, and ends the processing of FIG. 6.

Next, a matching operation by the matching unit 362 corresponding to the second process processing device 402-2 will be described using FIG. 6 illustrating a flowchart of a matching operation in the first exemplary embodiment. First, when the acquisition unit 3621 of the matching unit 362 detects that a new substrate is carried into the second process processing device 402-2 (step S11), the acquisition unit 3621 acquires the line ID, the second process passage time, and a matching image (substrate image) of the substrate (step S12). Then, the determination unit 3622 of the matching unit 362 first reads out the matching sequence (line ID/substrate ID string) of the second process (processing device 402-2) from the matching sequence DB 353 (step S13). Then, the determination unit 3622 sets 1 to the internal variable i representing the rank (step S14), and reads out a registration image of the line ID and the substrate ID in the $i^{th}$ rank from the top in the matching sequence, from the substrate DB 352 (step S15). Then, the determination unit 3622 calculates a score representing the degree of similarity between the matching image and the registration image (step S16). Then, the determination unit 3622 compares the score with a threshold (step S17).

When the score is larger than the threshold, the matching has succeeded, and the saving unit 3624 stores the second process passage time and the matching image in the fields for the second process passage time and a matching image of the entry having the registration image in which the matching has succeeded, in the substrate DB 352 (step S18). Then, the matching sequence determination unit 3623 updates the matching sequence of the second process (processing device 402-2) in the matching sequence DB 353 on the basis of the latest contents of the substrate DB 352 (step S19). Then, the matching unit 362 returns to step S11 and repeats the processing similar to that described above.

An example of the operation at step S19 will be described below using the case where the latest contents of the substrate DB 352 are those illustrated in FIG. 9, for example. First, the matching sequence determination unit 3623 extracts all entries in which the second process passage time and the matching images have a NULL value, among the entries of the substrate DB 352. In the case of FIG. 9, entries in the six rows from the bottom are extracted. Then, the matching sequence determination unit 3623 extracts, from the extracted entries, all entries in which the line ID stored in the line ID field is the same line ID as that of the second process processing device 402-2. In the case of FIG. 9, two entries in total, that is, the first and fourth entries from the bottom, are extracted. Then, the matching sequence determination unit 3623 creates a line ID/substrate ID string in which sets of the line IDs stored in the line ID fields and the substrates IDs stored in the substrate ID fields (line ID/substrate ID) in the extracted entries are aligned in the order of the first process passage time of the entry. In the case of FIG. 9, the line ID/substrate ID string is "L2, 003", "L2, 004". Then, the matching sequence determination unit 3623 writes the line ID/substrate ID string onto the matching sequence field of the second process (processing device 402-2) in the matching sequence DB 353.

When the score is not larger than the threshold, the determination unit 3622 increments the internal variable i by 1 (step S20), confirms that i is not larger than the lowest rank in the matching sequence (step S21), and returns to step S15 and repeats processing that is similar to the processing described above. Note that when i becomes larger than the lowest rank in the matching sequence, it means that the matching has failed even thought comparison between the entire registration images and the matching image has been completed according to the matching sequence. In that case, the saving unit 3624 outputs an error message, and ends the processing of FIG. 6.

Next, a matching operation by the matching unit 362 corresponding to the third process processing device 403 will be described using FIG. 6 illustrating a flowchart of a matching operation in the first exemplary embodiment. First, when the acquisition unit 3621 of the matching unit 362 detects that a new substrate is carried into the third process processing device 403 (step S11), the acquisition unit 3621 acquires the line ID, and the third process passage time and a matching image (substrate image) of the substrate (step S12). Then, the determination unit 3622 of the matching unit 362 first reads out the matching sequence (line ID/substrate ID string) of the third process from the matching sequence DB 353 (step S13). Then, the determination unit 3622 sets 1 to the internal variable i representing the rank (step S14), and reads out a registration image of the line ID and the substrate ID in the $i^{th}$ rank from the top in the matching sequence, from the substrate DB 352 (step S15). Then, the determination unit 3622 calculates a score representing the degree of similarity between the matching image and the registration image (step S16). Then, the determination unit 3622 compares the score with a threshold (step S17).

When the score is larger than the threshold, the matching has succeeded, and the saving unit 3624 stores the third process passage time and the matching image in the fields for the third process passage time and a matching image of the entry having the registration image in which the matching has succeeded, in the substrate DB 352 (step S18). Then, the matching sequence determination unit 3623 updates the matching sequence of the third process in the matching sequence DB 353 on the basis of the latest contents of the substrate DB 352 (step S19). Then, the matching unit 362 returns to step S11 and repeats the processing similar to that described above.

An example of the operation at step S19 will be described below using the case where the latest contents of the substrate DB 352 are those illustrated in FIG. 9, for example. First, the matching sequence determination unit 3623 extracts all entries in which the third process passage time and the matching images have a NULL value, among the entries of the substrate DB 352. In the case of FIG. 9, entries in the eight rows from the bottom are extracted. Then, the matching sequence determination unit 3623 creates a line ID/substrate ID string in which sets of the line IDs stored in the line ID field and the substrates IDs stored in the substrate ID field (line ID/substrate ID) in the extracted entries are aligned in the order of the first process passage time of the entry. In the case of FIG. 9, the line ID/substrate ID string is "L1, 003", "L2, 002", "L1, 004", "L1, 005", "L2, 003", "L1, 006", "L1, 007", "L2, 004". Then, the matching sequence determination unit 3623 writes the line ID/substrate ID string onto the field for the third process matching sequence in the matching sequence DB 353.

When the score is not larger than the threshold, the determination unit 3622 increments the internal variable i by 1 (step S20), confirms that i is not larger than the lowest rank in the matching sequence (step S21), and returns to step S15 and repeats processing that is similar to the processing described above. Note that when i becomes larger than the lowest rank in the matching sequence, it means that matching has failed even thought comparison between the entire registration images and the matching image has been completed according to the matching sequence. In that case, the saving unit 3624 outputs an error message, and ends the processing of FIG. 6.

As described above, according to the present embodiment, with use of a substrate image of a substrate carried into the second process processing device 402-1 or 402-2 or the third process processing device 403 as a matching image, and a substrate image of a substrate stored in the substrate DB 352 as a registration image, matching is performed between the matching image and the registration image. Thereby, it is possible to determine to which substrate stored in the substrate DB 352 the substrate carried into the second process processing device 402-1 or 402-2 or the third process processing device 403 is identical.

As described above, according to the present embodiment, it is possible to promptly detect a registration image matching the matching image. The reason is that a plurality of substrates passing through the first process processing device 401-1 tend to be carried into the second process processing device 402-2 of the same line and the third process processing device 403 while keeping the passing sequence, and a plurality of substrates passing through the first process processing device 401-2 tend to be carried into the second process processing device 402-2 of the same line and the third process processing device 403 while keeping the passing sequence. By utilizing such a feature of the production line 400, the matching sequence of the registration images on which matching with the matching image is performed is determined. Moreover, a registration image that matches the matching image is determined by comparing a score representing the degree of similarity between the matching image and the registration image with a determination threshold.

Third Exemplary Embodiment

Figure 11:
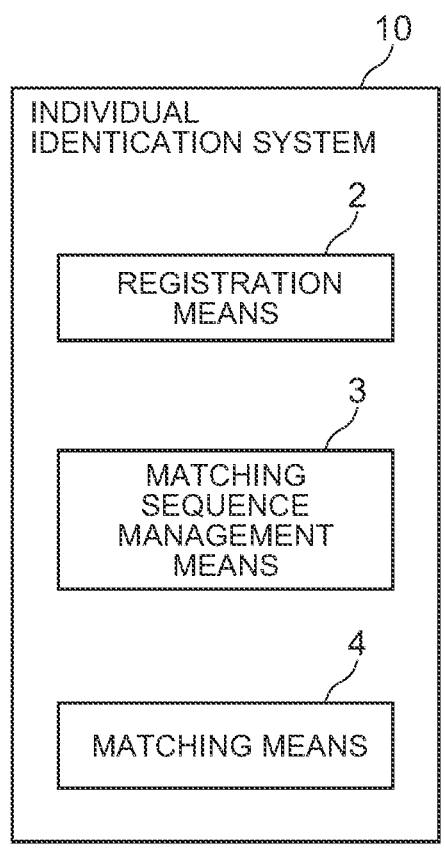
FIG. 11 is a block diagram of an individual identification device according to a third exemplary embodiment of the present invention.

Next, a third exemplary embodiment of the present invention will be described with reference to FIG. 11. FIG. 11 is a block diagram of an individual identification system according to the present embodiment.

Referring to FIG. 11, an individual identification system 10 according to the present embodiment is configured to include a registration means 2, a matching sequence management means 3, and a matching means 4.

The registration means 2 is configured to, each time a product to be registered is carried into an upstream side process of a plurality of processes constituting a production line for products, acquire a captured image of the product to be registered as a registration image, and store the registration image in a storage device in association with product information including information representing the sequence that the product of the registration object has passed through the upstream side process. The registration means 2 may have the same configuration as that of the registration unit 161 of FIG. 2 or the registration unit 361 of FIG. 8 for example, but is not limited thereto.

The matching sequence management means 3 is configured to manage the matching sequence in a downstream side process that is a process downstream of the upstream side process. The matching sequence management means 3 is configured to, each time matching has succeeded by the matching means 4, update the matching sequence to sequence in which registration images in which matching has not succeeded with any matching image, among registration images stored in the storage device, are put in order on the basis of the sequence that the products to be registered have passed through the upstream side process. The matching sequence management means 3 may have the same configuration as that of the matching sequence management unit 1624 of FIG. 2 or the matching sequence management unit 3624 of FIG. 8 for example, but is not limited thereto.

The matching means 4 is configured to, each time a product of a matching object is carried into the downstream side process, acquire a captured image of the product of the matching object as a matching image, and perform matching between the matching image and a registration image stored in the storage device according to the matching sequence.

The individual identification system 10 configured as described above operates as described below. First, each time a product to be registered is carried into the upstream side process of a plurality of processes constituting a production line for products, the registration means 2 acquires a captured image of the product to be registered as a registration image, and stores the registration image in a storage device in association with product information including information representing the sequence that the product of the registration object passed through the upstream side process. Then, each time a product of a matching object is carried into the downstream side process, the matching means 4 acquires a captured image of the product of the matching object as a matching image, and performs matching between the matching image and a registration image stored in the storage device according to the matching sequence managed by the matching sequence management means 3. Then, each time matching has succeeded by the matching means 4, the matching sequence management means 3 updates the matching sequence to sequence in which registration images in which matching has not succeeded with any matching image, among the registration images stored in the storage device, are put in order on the basis of the sequence that the products to be registered have passed through the upstream side process.

According to the individual identification system 10 that is configured and operates as described above, it is possible to promptly detect a registration image matching the matching image. The reason is that each time the matching means 4 succeeds in matching, the matching sequence management means 3 updates the matching sequence to sequence in which registration images in which matching has not succeeded with any matching image are put in order on the basis of the sequence that the products to be registered have passed through the upstream wide process, and each time a product of a matching object is carried into the downstream side process, the matching means 4 acquires a captured image of the product of the matching object as a matching image, and performs matching between the matching image and a registration image stored in the storage device according to the matching sequence managed by the matching sequence management means 3.

While the present invention has been described with reference to the exemplary embodiments described above, the present invention is not limited to the above-described embodiments. The form and details of the present invention can be changed within the scope of the present invention in various manners that can be understood by those skilled in the art.

For example, while a production line for producing substrates is used as an object, a production line to which the present invention is applicable is not limited thereto. The present invention is applicable to a production line for various types of products other than substrates.

Further, the embodiment illustrated in FIG. 7 shows an example in which the number of lines of the production lines is decreased in the downstream side. However, the present invention is also applicable to a production line in which the number of lines is increased in the downstream side. For example, the present invention is applicable to a production line in which two second process processing devices are connected to the downstream side of the first process processing device in parallel via a line branch part, some substrates ejected from the first process processing device are carried into one of the second process processing devices via the line branch part, and the rest of them are carried into the other of the second process processing devices via the line branch part.

Further, in the above-described embodiments, the determination units 1622 and 3622 are configured to determine a registration image that matches a matching image, by comparing a score indicating the similarity between the matching image and a registration image with a threshold. However, the determination unit 1622 and 3622 may be configured to perform matching between a matching image and a registration image on registration images that are narrowed down to those ranked at some places from the top in the matching sequence. At that time, assuming that the number of registration images that are narrowed down is k pieces, the determination units 1622 and 3622 may terminate the determination processing at the point of time when a registration image having a score exceeding the threshold appears. Alternatively, in the case where there is no registration image having a score exceeding the threshold in the k pieces of registration images, the determination units 1622 and 3622 may determine a registration image having the largest score in the k pieces to be a registration image that has succeeded in the matching with the matching image.

INDUSTRIAL APPLICABILITY

The present invention is applicable to the field of performing matching between two images. In particular, the present invention is applicable to the field of identifying individuals of products such as substrates flowing on a production line.

The whole or part of the exemplary embodiments disclosed above can be described as, but not limited to, the following supplementary notes.

(Supplementary Note 1)

An individual identification system comprising:

registration means for, each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;

matching sequence management means for managing matching sequence in a downstream side process that is a process downstream of the upstream side process; and matching means for, each time a product of a matching object is carried into the downstream side process, acquiring a captured image of the product of the matching object as a matching image, and performing matching between the matching image and the registration image stored in the storage device according to the matching sequence, wherein the matching sequence management means is configured to, each time the matching means succeeds in matching, update the matching sequence to sequence in which registration images not having succeeded in matching with any matching image, among the registration images stored in the storage device, are put in order on a basis of the passing sequence that the products to be registered passed through the upstream side process.

(Supplementary Note 2)

The individual identification system according to supplementary note 1, wherein in a case of a production line having a line configuration in which a number of lanes is changed in a way, the product information including the information representing the passing sequence that the products to be registered passed through the upstream side process is configured to include line information, and the matching sequence management means is configured to update the matching sequence on a basis of the line information.

(Supplementary Note 3)

The individual identification system according to supplementary note 1 or 2, wherein the matching means is configured to determine a registration image that matches the matching image, by comparing a score indicating similarity between the matching image and the registration image with a threshold.

(Supplementary Note 4)

The individual identification system according to any of supplementary notes 1 to 3, wherein the matching means is configured to perform matching between the matching image and the registration image on registration images that are narrowed down to registration images ranked at some places from top in the matching sequence.

(Supplementary Note 5)

The individual identification system according to any of supplementary notes 1 to 4, wherein the information representing the passing sequence that the product to be registered passed through the upstream side process is time information representing time that the product to be registered passed through the upstream side process.

(Supplementary Note 6)

An individual identification method comprising:

each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;

managing matching sequence in a downstream side process that is a process downstream of the upstream side process; and each time a product of a matching object is carried into the downstream side process, acquiring a captured image of the product of the matching object as a matching image, and performing matching between the matching image and the registration image stored in the storage device according to the matching sequence, wherein the managing the matching sequence includes, each time the matching succeeds, updating the matching sequence to sequence in which registration images not having succeeded in matching with any matching image, among the registration images stored in the storage device, are put in order on a basis of the passing sequence that the products to be registered passed through the upstream side process.

(Supplementary Note 7)

The individual identification method according to supplementary note 6, wherein in a case of a production line having a line configuration in which a number of lanes is changed in a way, the product information including the information representing the passing sequence that the products to be registered passed through the upstream side process is configured to include line information, and the managing the matching sequence includes updating the matching sequence on a basis of the line information.

(Supplementary Note 8)

The individual identification method according to supplementary note 6 or 7, wherein the performing the matching includes determining a registration image that matches the matching image, by comparing a score indicating similarity between the matching image and the registration image with a threshold.

(Supplementary Note 9)

The individual identification method according to any of supplementary notes 6 to 8, wherein the performing the matching includes performing matching between the matching image and the registration image on registration images that are narrowed down to registration images ranked at some places from top in the matching sequence.

(Supplementary Note 10)

A computer-readable storage medium storing thereon a program for causing a computer to perform processing of:

each time a product to be registered is carried into an upstream side process of a plurality of processes constituting a production line for products, acquiring a captured image of the product to be registered as a registration image, and storing the registration image in a storage device in association with product information including information representing passing sequence that the product to be registered passed through the upstream side process;

managing matching sequence in a downstream side process that is a process downstream of the upstream side process; and each time a product of a matching object is carried into the downstream side process, acquiring a captured image of the product of the matching object as a matching image, and performing matching between the matching image and the registration image stored in the storage device according to the matching sequence, wherein the managing the matching sequence includes, each time the matching means succeeds in matching, updating the matching sequence to sequence in which registration images not having succeeded in matching with any matching image, among the registration images stored in the storage device, are put in order on a basis of the passing sequence that the products to be registered passed through the upstream side process.

REFERENCE SIGNS LIST 1 individual identification system
100 individual identification device
200 production line
201 first process processing device
202 second process processing device
203 third process processing device
204 substrate loading unit
205 substrate takeout unit
206 conveying machine

What is claimed is:

1. An individual identification system comprising:
a first detector that detects products to be registered when the products enter an upstream process of a plurality of processes constituting a production line for products, the first detector detecting the products as the products individually enter the upstream process;
a second detector that detects the products when the products enter a downstream process of the plurality of processes, the downstream process being downstream from the upstream process, the second detector detecting the products as the products individually enter the downstream process;
a first memory containing program instruction; and
a processor coupled to the first memory, wherein the processor is configured to execute the program instructions to:
when the first detector detects a current upstream product of the products, acquire a captured upstream image of the detected current upstream product to be registered as a registration image, and store the registration image in a second memory in association with product information including information representing a passing sequence of the products through the upstream process;
manage a matching sequence of the products through the downstream process; and
when the second detector detects a current downstream product of the products, acquire a captured downstream image of the detected current downstream product, and perform matching between the captured downstream image and the registration image stored in the second memory for the current upstream product corresponding to the current downstream product, according to the matching sequence,
wherein management of the matching sequence includes, when the matching succeeds, updating the matching sequence to include just the registration image of each of the products that have not been matched with the captured downstream image, in an order corresponding to the products in the passing sequence.

2. The individual identification system according to claim 1, wherein
in a case in which the production line has a line configuration in which a number of lanes is changed in a certain way, the product information including the information representing the passing sequence is configured to include line information, and
the processor is further configured to execute the instructions to update the matching sequence on a basis of the line information.

3. The individual identification system according to claim 1, wherein the processor is further configured to execute the instructions to
determine the registration image that matches the captured downstream image, by comparing a score indicating a similarity between the captured downstream image and the registration image with a threshold.

4. The individual identification system according to claim 1, wherein the processor is further configured to execute the instruction to
perform the matching between the captured downstream image and the registration image on registration images that are narrowed down to registration images ranked at some places from a top in the matching sequence.

5. The individual identification system according to claim 1, wherein
the information representing the passing sequence is time information representing times that the products passed through the upstream process.

6. An individual identification method comprising:
detecting, by a first detector, products to be registered when the products enter an upstream process of a plurality of processes constituting a production line for products, the first detector detecting the products as the products individually enter the upstream process;
detecting, by a second detector, the products when the products enter a downstream process of the plurality of processes, the downstream process being downstream from the upstream process, the second detector detecting the products as the products individually enter the downstream process;
when the first detector detects a current upstream product of the products, acquiring a captured upstream image of the detected current upstream product as a registration image, and storing the registration image in a second memory in association with product information including information representing a passing sequence of the products through the upstream process;
managing a matching sequence of the products through the downstream process; and
when the second detector detects a current downstream product of the products, acquiring a captured downstream image of the detected current downstream product, and performing matching between the captured downstream image and the registration image stored in the second memory for the current upstream product corresponding to the current downstream product, according to the matching sequence,
wherein management of the matching sequence includes, when the matching succeeds, updating the matching sequence to include just the registration image of each of the products that have not been matched with the captured downstream image, in an order corresponding to the products in the passing sequence.

7. The individual identification method according to claim 6, wherein
in a case in which the production line has a line configuration in which a number of lanes is changed in a certain way, the product information including the information representing the passing sequence is configured to include line information, and the method further comprises updating the matching sequence on a basis of the line information.

8. The individual identification method according to claim 6, further comprising
determining the registration image that matches the captured downstream image, by comparing a score indicating a similarity between the captured downstream image and the registration image with a threshold.

9. The individual identification method according to claim 6, further comprising
performing the matching between the captured downstream image and the registration image on registration images that are narrowed down to registration images ranked at some places from a top in the matching sequence.

10. A non-transitory computer-readable storage medium storing a program executable by a computer to perform processing,
wherein a first detector detects products to be registered when the products enter an upstream process of a plurality of processes constituting a production line for products, the first detector detecting the products as the products individually enter the upstream process,
wherein a second detector that detects the products when the products enter a downstream process of the plurality of processes, the downstream process being downstream from the upstream process, the second detector detecting the products as the products individually enter the downstream process, and
wherein the processing comprises:
when the first detector detects a current upstream product of the products, acquiring a captured upstream image of the detected current upstream product as a registration image, and storing the registration image in a second memory in association with product information including information representing a passing sequence of the products through the upstream process;
managing a matching sequence of the products through the downstream process; and
when the second detector detects a current downstream product of the products, acquiring a captured downstream image of the detected current downstream product, and performing matching between the captured downstream image and the registration image stored in the second memory for the current upstream product corresponding to the current downstream product, according to the matching sequence,
wherein management of the matching sequence includes, when the matching succeeds, updating the matching sequence to include just the registration image of each of the products that have not been matched with the captured downstream image, in an order corresponding to the products in the passing sequence.

* * * * *